US 9,160,293 B2

(12) United States Patent
Schober et al.

(10) Patent No.: US 9,160,293 B2
(45) Date of Patent: Oct. 13, 2015

(54) ANALOG AMPLIFIERS AND COMPARATORS

(71) Applicants: Robert C. Schober, Huntington Beach, CA (US); J. Daniel Likins, Tustin, CA (US)

(72) Inventors: Robert C. Schober, Huntington Beach, CA (US); J. Daniel Likins, Tustin, CA (US)

(*) Notice: Subject to any disclaimer, the term of this patent is extended or adjusted under 35 U.S.C. 154(b) by 0 days.

(21) Appl. No.: 14/480,054

(22) Filed: Sep. 8, 2014

(65) Prior Publication Data

US 2015/0070091 A1     Mar. 12, 2015

Related U.S. Application Data

(60) Provisional application No. 61/875,024, filed on Sep. 7, 2013.

(51) Int. Cl.
| | |
|---|---|
| *H03F 1/02* | (2006.01) |
| *H03G 1/00* | (2006.01) |
| *H03F 3/45* | (2006.01) |

(52) U.S. Cl.
CPC ......... *H03G 1/0017* (2013.01); *H03F 3/45179* (2013.01); *H03F 2200/153* (2013.01); *H03F 2203/45101* (2013.01)

(58) Field of Classification Search
CPC ....................................................... H03F 1/02
USPC .............................. 330/9, 51, 76, 207 A, 251
See application file for complete search history.

(56) References Cited

U.S. PATENT DOCUMENTS

| | | | |
|---|---|---|---|
| 4,691,189 A | 9/1987 | Dingwall et al. | |
| 4,816,701 A | 3/1989 | Ando et al. | |
| 4,897,655 A | 1/1990 | Zazzu et al. | |
| 4,899,068 A | 2/1990 | Klose et al. | |
| 4,989,003 A | 1/1991 | Sauer | |
| 5,010,338 A | 4/1991 | Miki et al. | |
| 5,165,058 A | 11/1992 | Nakatani et al. | |
| 5,262,779 A | 11/1993 | Sauer | |

(Continued)

FOREIGN PATENT DOCUMENTS

| | | |
|---|---|---|
| EP | 0404476 A2 | 12/1990 |
| EP | 0695035 A1 | 1/1996 |
| EP | 1261128 A2 | 11/2002 |
| EP | 1569342 A1 | 8/2005 |

OTHER PUBLICATIONS

Dingwall, Andrew G. F., Monolithic Expandable 6 Bit 20 MHz CMOS/SOS A/D Converter, IEE Journal of Solid-Sate Circuit, vol. SC-14, No. 6, pp. 926 to 932, Dec. 1979; 7 pages.

(Continued)

*Primary Examiner* — Henry Choe
(74) *Attorney, Agent, or Firm* — Lee & Hayes, PLLC

(57) ABSTRACT

An innovative analog circuit design using digital components is disclosed. Embodiments of the present invention includes, but not limited to analog amplifiers and comparators. An amplifier of an embodiment of the present invention includes an inverter, a plurality of switches, offset capacitor and flying capacitor. The one terminal of the offset capacitor is connected to the input of the inverter. During setup phase of clock signals, the switches are configured to connect input and output of the inverter and to connect the flying capacitor to input terminals of the amplifier, respectively, for storing a differential input voltage. Then, during the enable phase of the clock signals, the switches are configured to connect the first terminal of the second capacitor and the first terminal of the first capacitor, and to connect the second terminal of the second capacitor to the output of the inverter.

8 Claims, 21 Drawing Sheets

(56) References Cited

U.S. PATENT DOCUMENTS

| | | | |
|---|---|---|---|
| 5,327,131 | A | 7/1994 | Ueno et al. |
| 5,461,381 | A * | 10/1995 | Seaberg ........................ 341/143 |
| 6,069,500 | A | 5/2000 | Kao |
| 6,963,300 | B1 | 11/2005 | Lee |
| 7,973,596 | B2 * | 7/2011 | Eschauzier et al. ................ 330/9 |
| 8,125,253 | B2 * | 2/2012 | Goldman et al. ............. 327/156 |
| 8,710,887 | B2 | 4/2014 | Osame et al. |
| 2010/0289568 | A1 * | 11/2010 | Eschauzier et al. ................ 330/9 |
| 2013/0193981 | A1 | 8/2013 | Chen et al. |

OTHER PUBLICATIONS

Hershberg, Benjamin et al., 27.2 Ring Amplifier for Switched-Capacitor Circuits, ISSCC 2012 / Session 27 / Data Converter Techniques, 2012 IEEE International Solid-State Circuits Conference, p. 460 to 462, 2012; 3 pages.

Maloberti, Franco, CMOS Comparators, Course Integrated Circuit Design, Department of Electronics, University of Pavia, 2009; 43 pages.

Pimenta, Tales Cleber et al., A Successive Approximation ADC using PWM Technique for Bio-Medical Applications, Chapter 1, INTECH, 2013; 16 pages.

Tangel, Ali et al., The CMOS Inverter as a Comparator in ADC Design, Analog Integrated Circuits and Signal Processing, 39, 147-155, 2004; 2 pages.

Dingwall, Andrew G. F. "Monolithic Expandable 6 Bit 20 MHz CMOS/SOS A/D Converter", IEEE Journal of SolidState Circuits, vol. SC-14, No. 6, Published Dec. 1979, 7 pages.

* cited by examiner

[d] Transmission Gate Detail

[e] Inverter Detail

```
Fast              Fast
Slow              Fast

Typical

Slow              Slow
Slow              Fast
```

Figure 5b

| Gain | 1 Stage | 3 Stage | 5 Stage | 7 Stage |
|---|---|---|---|---|
| Low | 20 x | 8K x | 3.2M x | 1.3B x |
| Typical | 30 x | 30K x | 25M x | 20B x |
| High | 50 x | 125K x | 325M x | 800B x |

Figure 6

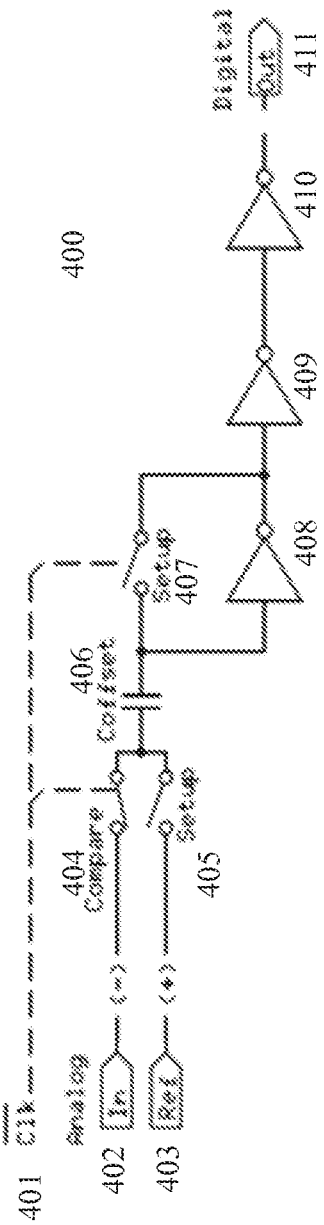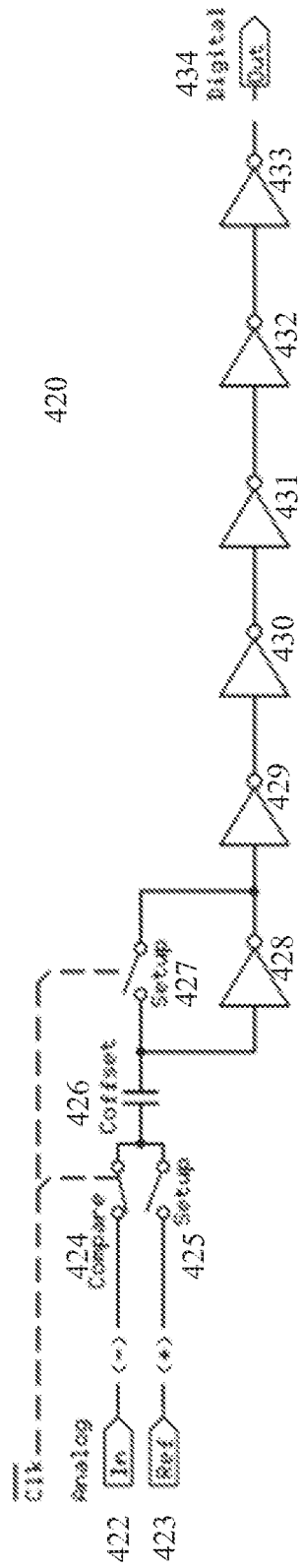
Figure 11a
Figure 11b

US 9,160,293 B2

ANALOG AMPLIFIERS AND COMPARATORS

CROSS-REFERENCE TO RELATED APPLICATIONS

This application claims priority to U.S. Provisional Patent Application No. 61/875,024, filed on Sep. 7, 2013, the disclosure of which is incorporated herein by reference in its entirety.

STATEMENT REGARDING FEDERALLY SPONSORED RESEARCH OR DEVELOPMENT

NONE.

NAMES OF THE PARTIES TO A JOINT RESEARCH AGREEMENT

NONE.

REFERENCE TO A "SEQUENCE LISTING"

NONE.

BACKGROUND OF THE INVENTION

1. Field of the Invention

The present invention directs to an innovative analog circuit design using digital components. The present invention further directs to improvements in utilizing semiconductor processing, providing lower noise analog design platforms, allowing lower power supply voltage, higher speed, and fewer component restrictions.

2. Description of Related Art

There is no related art because in the last few years no one has come forward with a solution to making analog in the latest integrated circuit processes. This is not an alternate solution, but a solution where there is none. Current analog IC technology is not scalable into "ultra-deep", "deep-sub-micron" integrated circuit processes. FIG. 1 illustrates electric field strength across deep sub-Micron MOS gates, such as that across a MOS transistor gate oxide. Three million volts is the amount of voltage it takes to draw a discharge across one meter in the air. 15 millivolts is the equivalent voltage for the same field strength at 50 Angstroms. 50 Angstroms is the gate oxide thickness for about 12 nanometer process transistors. The gate oxide of 12 nanometer process transistors will actually withstand about 1 volt. At 1 meter, this is the equivalent field strength of 200 million volts. Allowable electric field strength is a hard limiting factor that restricts the operational integrated circuit voltage, thus severely limiting analog signal swing. Photolithography and relative atomic structure dimension are some of many other limiting factors.

As Integrated Circuit technology shrinks, following More's Law, integration of analog circuits/designs has not been able keep up with that of digital circuits. This is due to various physical limitations. For instance, thinner gate oxide punches through because it cannot withstand the same voltage as the thicker ones, limiting the operating voltage to near a volt or less. To compensate, the threshold voltage must be reduced to continue to have a sufficient operating band for analog signals. The operating band is the power supply voltage minus the sum of the thresholds. This operating band grows increasingly smaller with process shrinks.

In order to produce mixed-mode devices, the analog circuits are constructed at a larger scale that interferes with the new process transistors and requires older style transistors for the analog portion which ultimately lowers yield, and thus results in higher cost.

Therefore, there is a need for an approach that does not require these conflicting processing steps.

BRIEF SUMMARY OF THE INVENTION

According to one aspect of the present invention, it provides a solution to analog integrated circuit design, using an all-digital process which does not yet possess the analog design mainstays (extensions). Unlike a conventional analog design, the present invention does not require matched differential pairs and current mirrors, as currently employed in industry. This is designing key analog circuits with only digital process parts.

According to another aspect of the present invention, it provides certain analog functions that are made with only digital components, using digital design automation tools and delivered as computer files, intended for use in a digital CAD environment. This is analog in a digital design flow.

According to yet another aspect of the present invention, it provides analog functions that do not require one or more precision parts, matching parts, and current mirrors. Those analog functions would be insensitive to variations in process parameters. This is precision without precision parts.

According to a further aspect of the present invention, it provides "deep-submicron" analog designs that work with power supplies of 1 volt or less. The analog inputs and outputs are valid from rail-to-rail. Noise is reduced, resulting in superior signal-to-noise ratios. The analog functions of the present invention are essentially as compact as logic, and can operate at logic speeds. This is high performance.

BRIEF DESCRIPTION OF THE SEVERAL VIEWS OF THE DRAWINGS

FIG. 2b shows a schematic diagram of a transmission gate of FIG. 2a;

FIG. 2c shows a schematic diagram of an clock inverter of FIG. 2a;

FIG. 2d shows a schematic diagram of a transmission gate of FIG. 2a;

FIG. 5b shows four (4) extreme process corners/conditions for FIG. 5a;

FIG. 6 shows a table illustrating relative voltage gains of various inverter chains biased at their sweet-spot;

FIGS. 11a to 11b, 11d show schematic diagrams of various gain implementations of the comparators of FIG. 10 in accordance with the principles of this invention; FIG. 11e shows a graph of output response by the comparator shown in FIG. 11d to a finely stepped input.

The present invention will now be described in more detail with reference to the accompanying drawings.

DETAILED DESCRIPTION OF THE INVENTION

Analog Amplifier

An analog amplifier of a preferred embodiment of the present invention utilizes digital parts/components. For example, the central component is a digital inverter. The inverter input (the cause) is the inverse of the inverter output (the effect), therefore when the inverter output is feedback (connected to the inverter input); the inverter input will find equilibrium. This equilibrium will be referred to as the "sweet-spot." The sweet-spot is the voltage where the inverter has its highest gain and fastest slew rate, thus the greatest sensitivity, and will be somewhere near the center of the power supply rails.

The output does not necessarily find the sweet spot; it is the input that always determines the sweet-spot. While the sweet-spot is not precise, it can be precisely measured before each operation and stored, for subsequent use during each operation. Changes in the precise voltage of the sweet-spot can be caused by numerous effects including ageing, temperature, power supply voltage, and 1/f phenomena such as shot noise. This auto calibration before each measurement eliminates discrepancies caused by the aforementioned.

Figure 1:
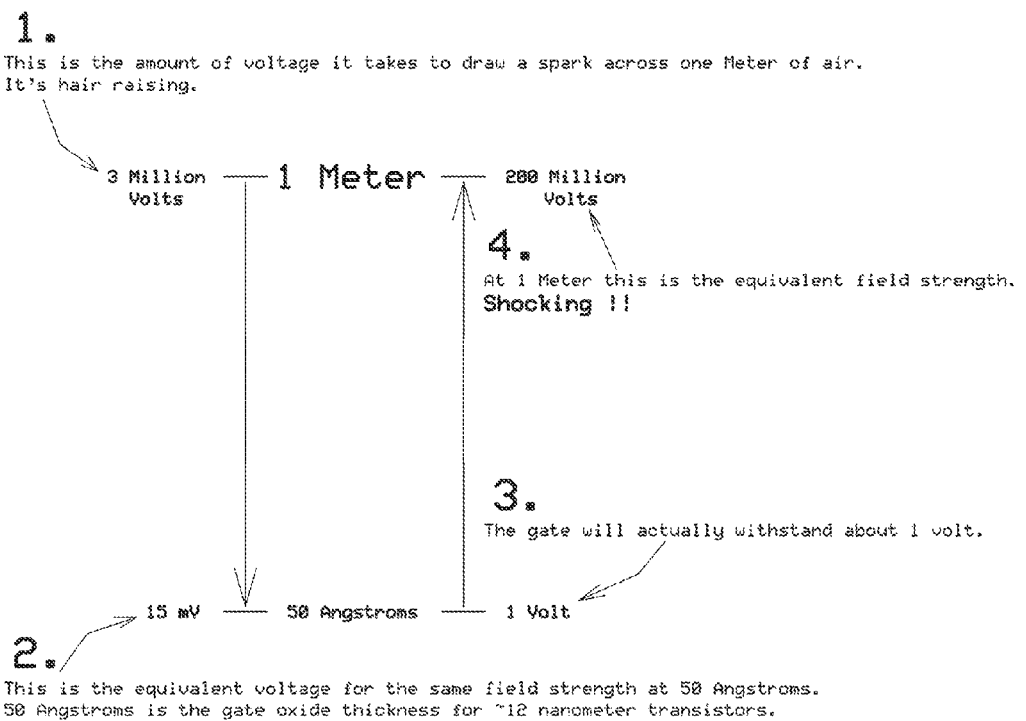
FIG. 1 shows a conceptual diagram, illustrating electric field strength, representing a MOS gate structure and its response to applied fields at dimensional limits.
Figure 2A:
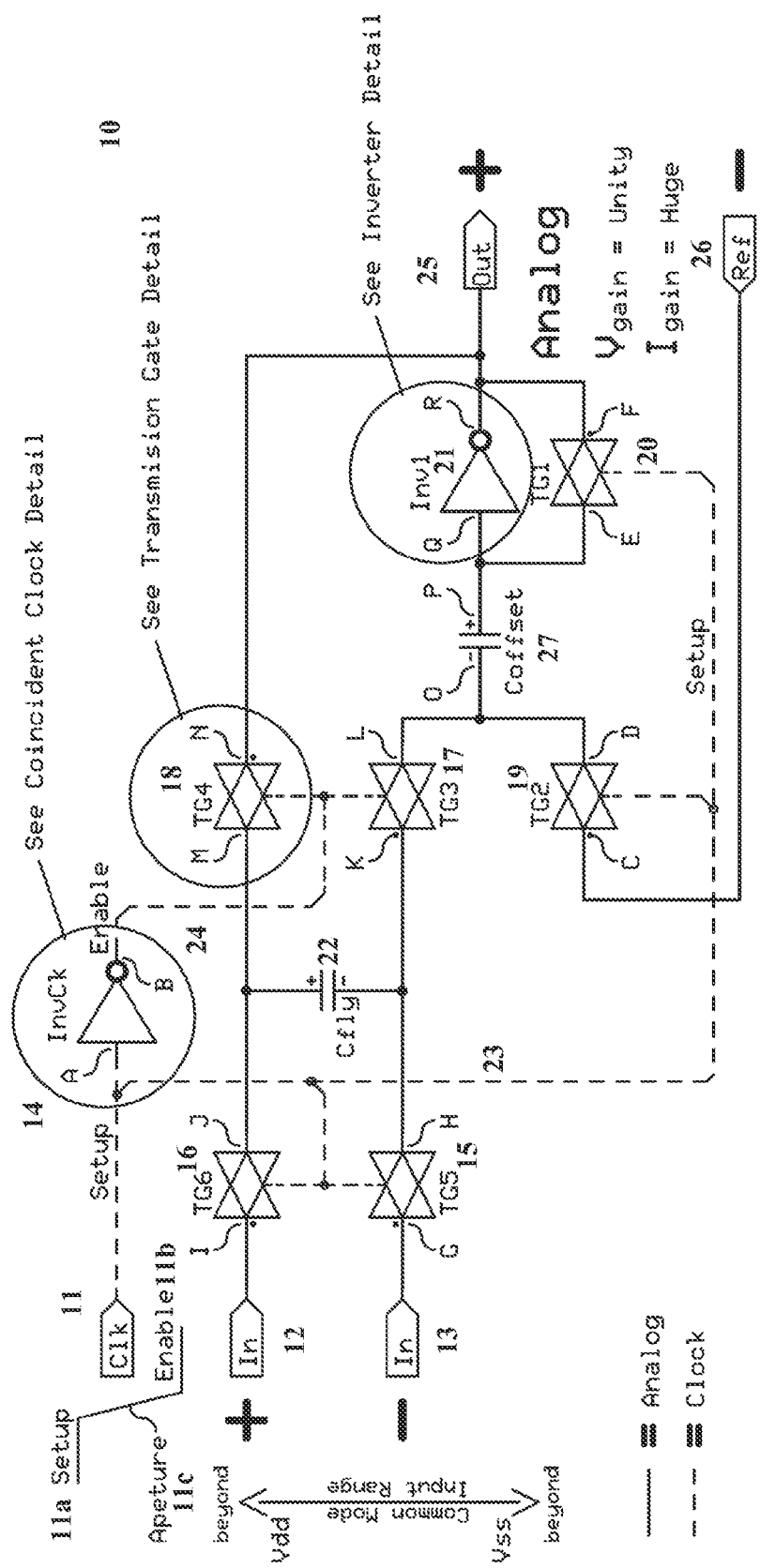
FIG. 2a shows a schematic diagram for an analog amplifier (basic configuration) in accordance with the present invention.
Figure 3:
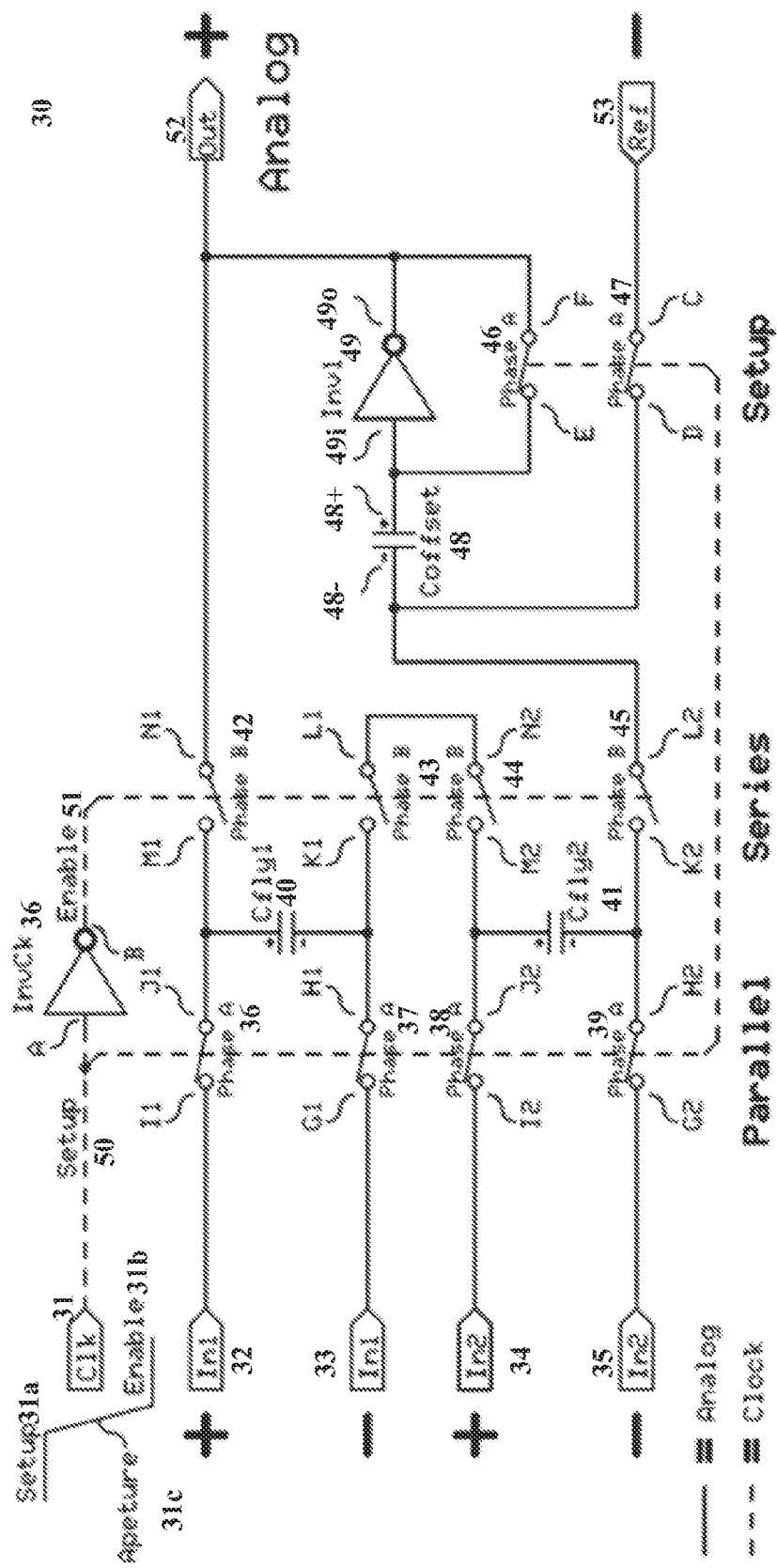
FIG. 3 shows a schematic diagram for a second analog amplifier (Multiple Inputs) in accordance with the present invention.

Referring to FIG. 2a, if a voltage is inserted in the feedback path through transmission gates 17 and 18, the input to inverter 21 will find equilibrium while the output from inverter 21 is offset by an amount equal to the inserted voltage. Transmission gates may be replaced with other types of switches as appropriate. The inserted voltage can come from a capacitor 22 that is connected first to the source signal and then connected in the feedback path. This leaves the input 12 and 13 to the amplifier 10 effectively isolated from the output 25 and output zero reference 26 of amplifier 10. In this configuration, the closed loop voltage gain is unity while the current gain can be as great as required, allowing operation at logic speed. The use of multiple capacitors (i.e. flying capacitors 69 and 70 in FIG. 4), connected first in parallel and then in series can offer voltage gain in integer increments with high precision. Multiple capacitors (i.e. flying capacitors 40 and 41 as shown in FIG. 3) can be used to sum voltages from different inputs, again with great precision.

Referring back to FIG. 2a, offset capacitor 27 allows a variable output voltage reference for a zero input voltage, making the output zero reference 26 independent of the input 12 and 13. Offset capacitor 27 stores the difference between the sweet-spot and analog ground (aka output zero reference 26), allowing analog ground to be at any voltage including voltages outside the power supply rails. Also, the input signals are not constrained to operate within the power supply rails.

Figure 2B:
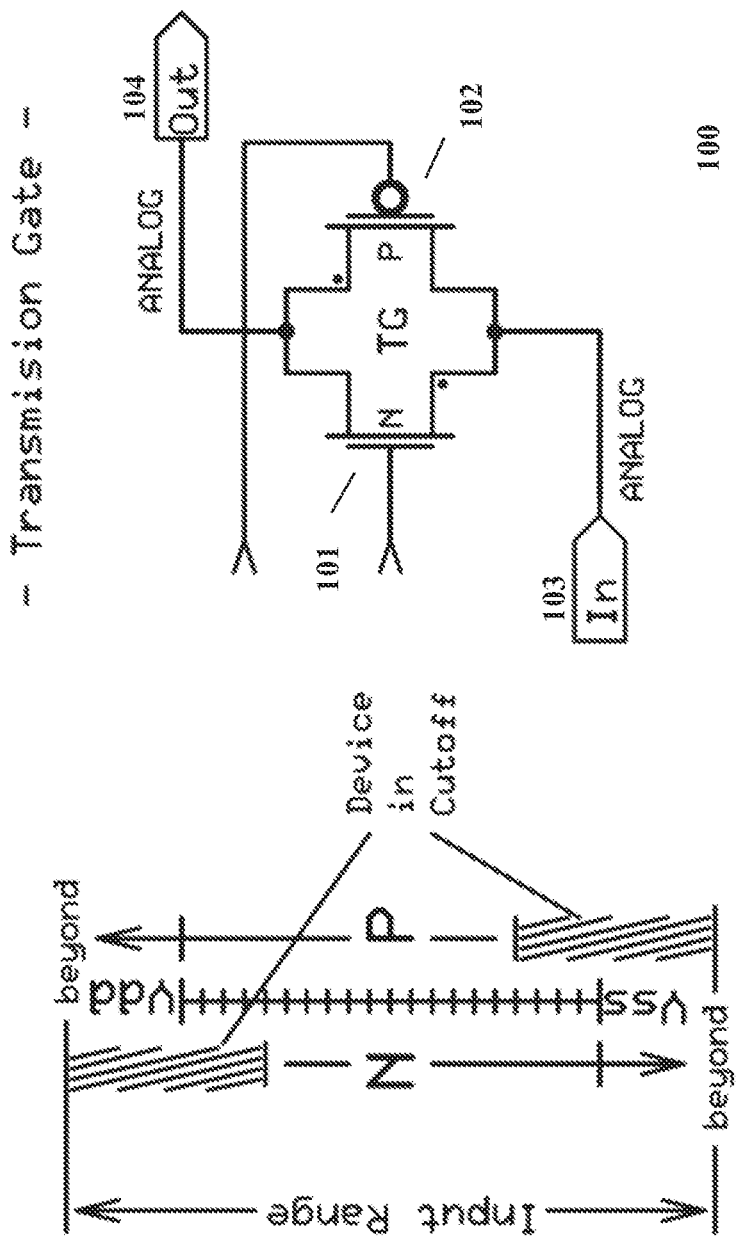
Figure 2C:
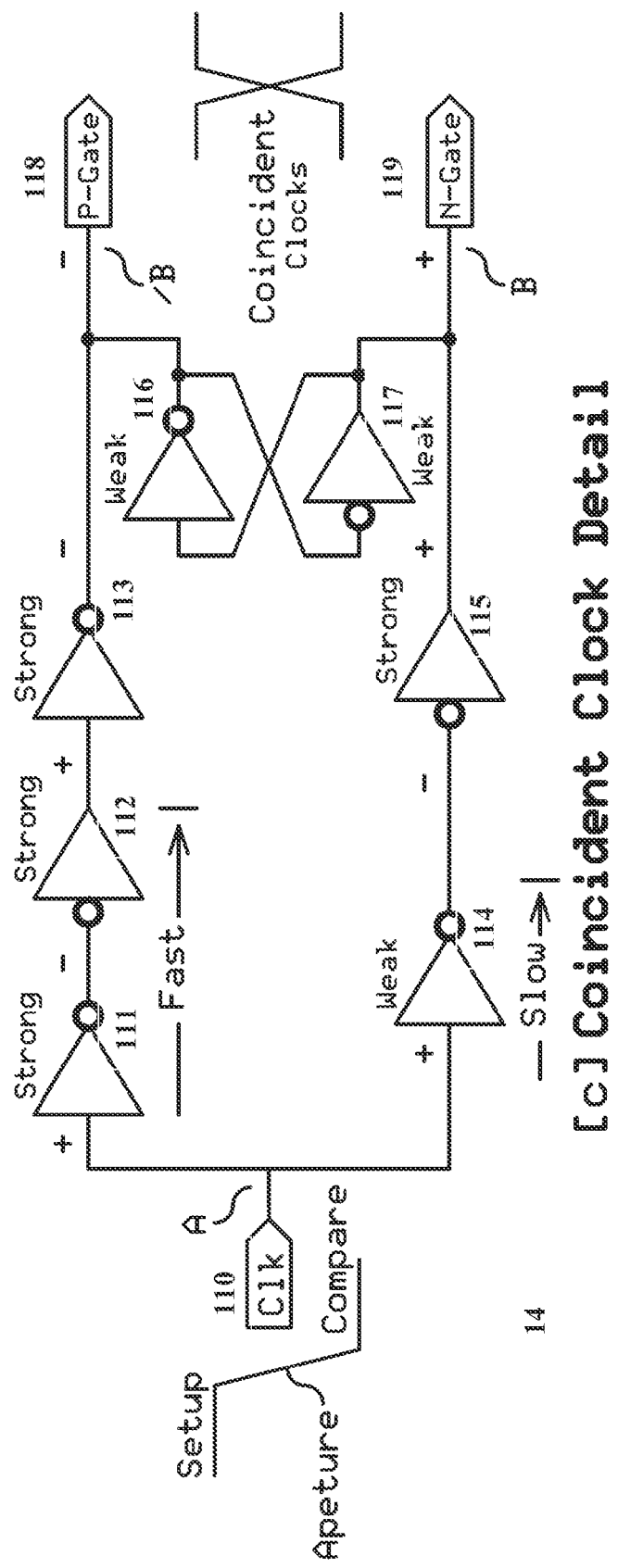
Figure 2D:
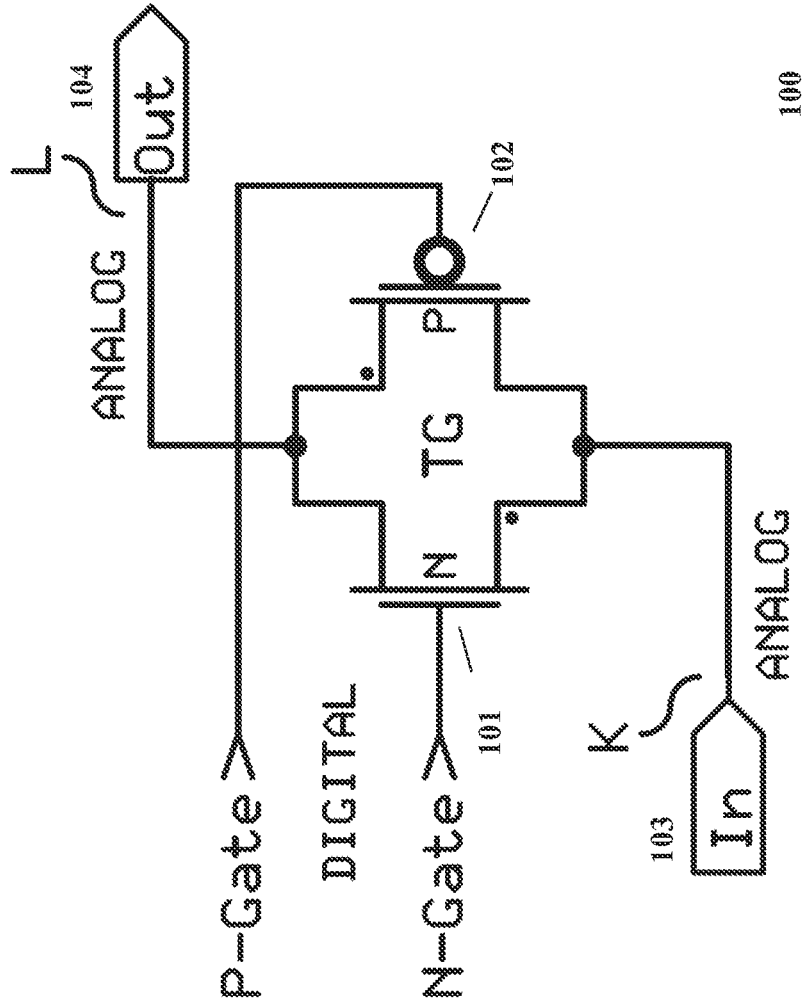
Figure 2E:
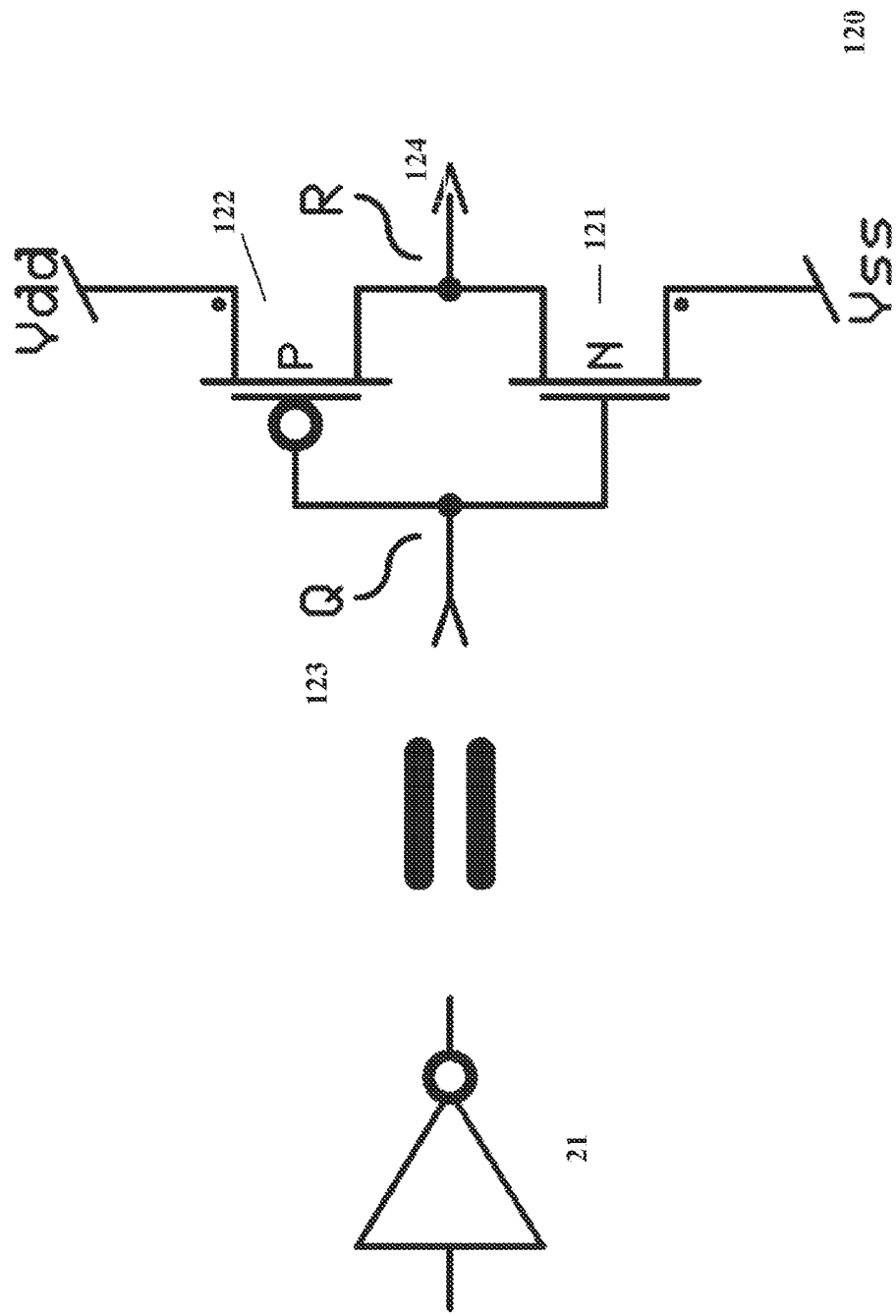
FIG. 2e shows a schematic diagram of an inverter of the present invention.

FIG. 2a shows a schematic diagram of a unity voltage gain analog amplifier 10 made with digital parts using digital design automation tools in accordance with the present invention. The unity voltage gain analog amplifier 10 receives Clk or clock signal 11, having setup phase 11a, transitional phase or aperture 11c, then enabling phase 11b. There are two voltage input terminals, one is In 12 (non-inverting), and the other is In 13 (inverting). At the transition of the clock 11 from Setup 11a to Enable 11b, the Out terminal 25 produces an analog representation of the analog voltage difference between the terminals In 12 and In 13. The output (ZERO) reference voltage is independently established by Ref 26 terminal, exclusive of the input common mode voltage at the In 12, 13 terminals. There are a number of transmission gates 15, 16, 17, 18, 19 and 20 that are used, and are made with both N-channel 101 and P-channel 102 FETs as shown in FIG. 2b. Transmission gates 15, 16, 17, 18, 19 and 20 receive control signals, which are complementary and coincident clocks as shown in FIG. 2c, which further contributes to lower noise aspects. Referring back to FIG. 2a, inverter 21 is a typical digital logic configuration 120 as shown in FIG. 2e, with the provision that N-channel 121 and P-channel 122 devices are sized to enhance operation by optimizing the "sweet spot."

Operation of the amplifier shown in FIG. 2a during the two phases (Setup 11a & Enable 11b) is described below:

Setup Phase:

First, the output R of inverter 21 is connected to the input Q of inverter 21 through transmission gate 20, which is controlled by setup signals 23. This establishes a self-bias voltage where inverter 21 is balanced at its sweet spot, which is its natural equilibrium (balanced tipping point), the voltage at which the Input at Q of inverter 21 is equal to the inverse of the Output voltage at R of inverter 21.

Second, at the same time as inverter 21 establishes at its natural equilibrium as described above, Ref 26 terminal is connected to one terminal O of offset capacitor 27 through transmission gate 19, while the other terminal P of offset capacitor 27 is connected to the self-bias voltage at input Q of inverter 21. The difference between the output reference voltage at terminal C of transmission gate 19 and the self-bias voltage at input Q of inverter 21 is stored on offset capacitor 27, this allows the voltage on Output 25 terminal to be with respect to any voltage from Rail-to-Rail as a reference or analog ground.

Third, flying capacitor 22 is connected between output terminals H and J of transmission gates 15 and 16, thus during the setup phase 11a, flying capacitor 22 is connected to In 12 terminal and In 13 terminal. The input path through In 12 terminal and In 13 terminal is not referenced to anything in amplifier 10, so input at In 12 terminal and In 13 terminal of amplifier 10 can be at any voltage from Rail-to-Rail and beyond, independent of Ref 26 terminal.

Enable Phase:

When Clk 11 transitions to enable phase 11b, it causes transmission gates 15, 16, 19 and 20 to be OFF, and causes transmission gates 17 and 18 to be ON, connecting the unknown voltage on first terminal of flying capacitor 22 in series with offset capacitor 27 through transmission gate 17, and connecting second terminal of flying capacitor 22 to output R of inverter 21 through transmission gate 18 in order to establish a closed loop, and provide a negative feedback path that includes the sum of the unknown input voltage (differential between In 12 terminal and In 13 terminal) and the output offset voltage. This causes Out 25 terminal to assume the necessary voltage to maintain input Q of inverter 21 at the self-bias equilibrium point. Inverter (InvCk) 14 is an abstract representation of FIG. 2c, where clock (Clk) 110 generates complementary coincident drive signals 118, 119 used to operate the transmission gates.

Because, as shown in FIG. 2a, In 12 and In 13 terminals are not directly connected to the output of amplifier 10, amplifier 10 can be made inverting or non-inverting by simply swapping the polarity of flying capacitor 22 as it is switched (not shown).

Since digital parts are used for amplifier 10, there are no precision analog components/parts and no matched parts that may be required. It is also noted that the unity voltage gain analog amplifier 10 would have no current mirrors or differential pairs; however, amplifier 10 would use closed loop feedback and operates at logic speed. This implementation works in "deep-submicron" designs, with power supplies of 1 volt or less. This design technique is advantageous anywhere that precision parts are not available. The output of amplifier 10 operates from Rail-to-Rail, this is highly desirable since the power supply voltage may be severely limited. The Input can operate from Rail-to-Rail and outside the rails by some significant amount. The input and output are not directly connected to each other, meaning the input can be referenced to a completely different voltage, or operating point, from the output. Since input and output are not directly connected to each other, noise on the input would not be coupled to the output or vice versa.

Note that the maximum clock rate is closely related the maximum clock rate of the digital logic family chosen for an embodiment of the present invention, and the clock rate is not a function of the present invention. Use of digital logic in analog circuit design minimizes capacitive loading thus maximizes performance.

FIG. 3 shows a schematic diagram of a sum or difference analog amplifier 30 with multiple input sources in accordance with the present invention. Amplifier 30 takes two sets of input voltages, a first set on terminals, In 32 and 33, and a second set on terminals, In 34 and 35. In this configuration, the output 52 of the amplifier 30 is the sum of the two inputs, where the signs of the inputs can be the same or different.

Figure 4:
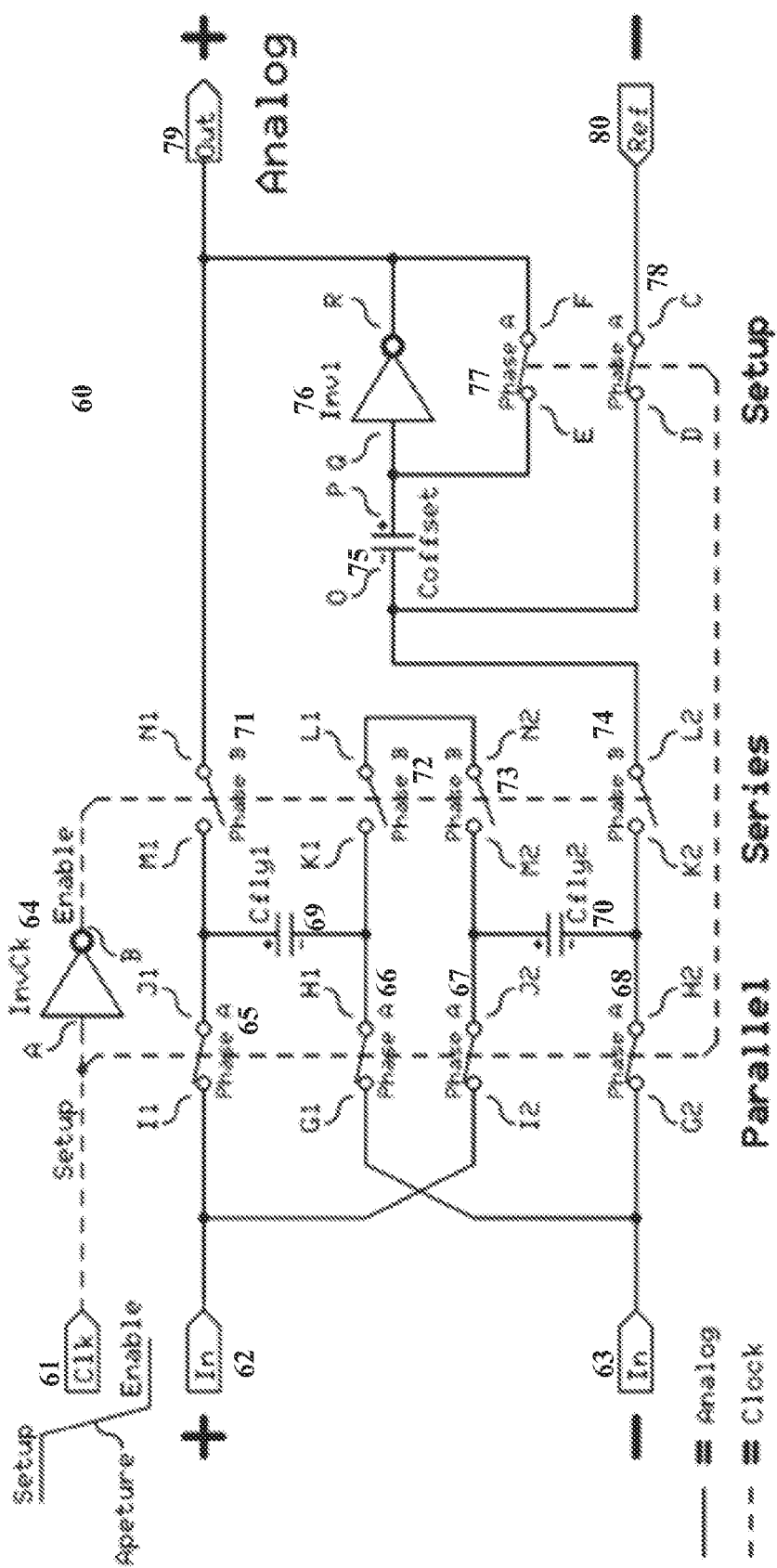
FIG. 4 shows a schematic diagram for a third analog amplifier (2× Gain) in accordance with the present invention.

FIG. 4 is a special case example of the amplifier shown in FIG. 3. FIG. 4 shows an analog amplifier with precision 2× gain. Precision voltage gain can be realized by impressing the same input voltage on two flying capacitors 69 and 70 during the setup phase and then putting those capacitors 69 and 70 in series during the enable phase. The sum is precisely 2 times the source. Two capacitors when placed in parallel will acquire the same terminal voltage independent of capacitive tolerance. The same capacitors when placed in series must by mathematical definition, present twice the terminal voltage. A high impedance circuit would allow the use of the precision voltage without disturbing it. More than two capacitors would allow gain greater than 2×.

Figure 5A:
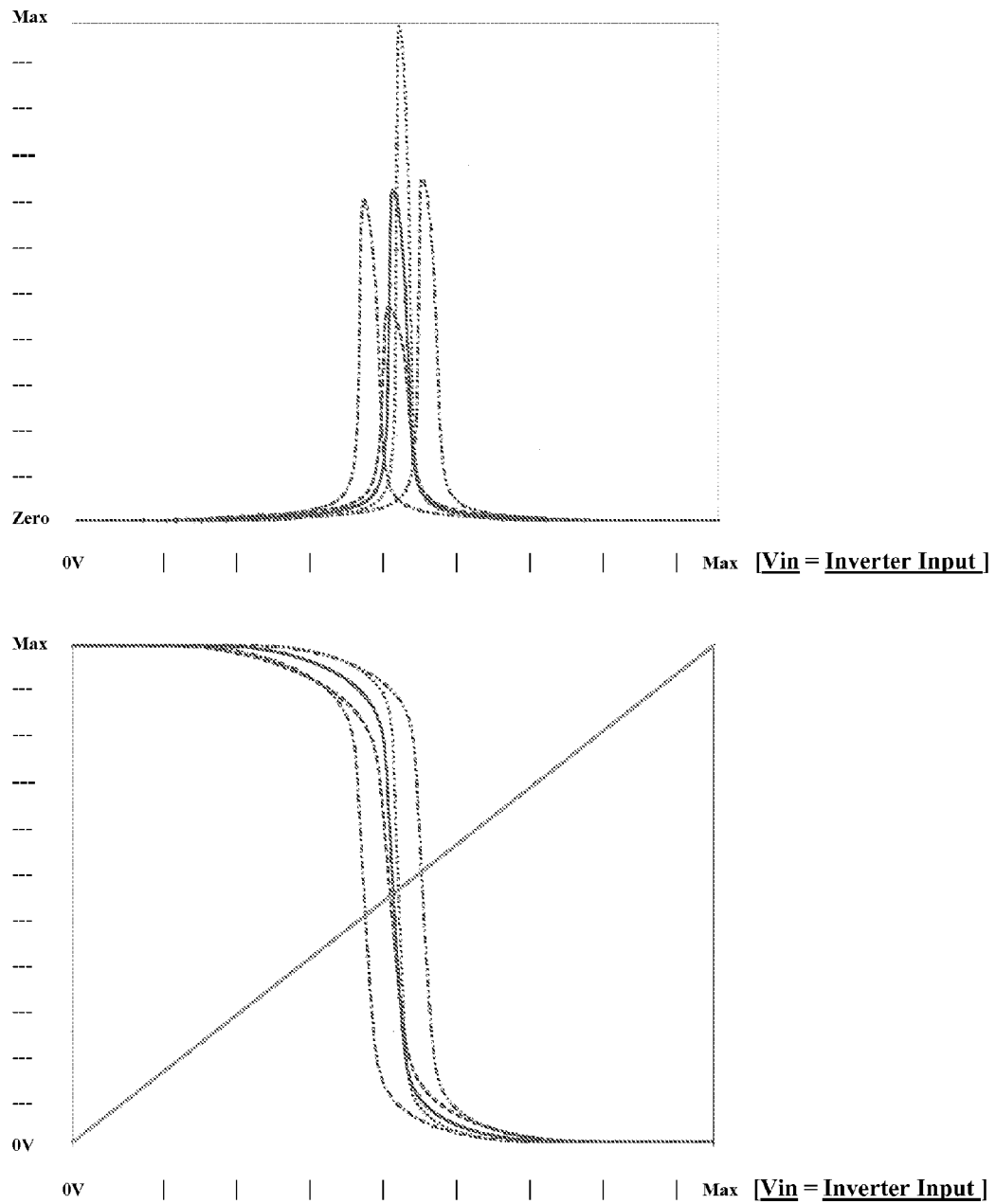
FIG. 5a shows two graphs, illustrating a representative CMOS inverter gain and transfer plot at various process corners.

FIG. 5a shows a gain plot and transfer function plot of a representative CMOS inverter FIG. 2e used in an embodiment of the present invention. FIG. 5a illustrates how much the actual FET parameters might move around, as a result of processing. For nominal and each of the 4 corner extremes as indicated in FIG. 5b, the bottom portion of the plot shows correlations between the input voltage presented to the CMOS inverter and the output voltage from the CMOS inverter, known as the transfer function. The 45 degree diagonal line intersects each transfer curve at the inverter's several "sweet-spots," or places where Vin=−(Vout). As it can be seen by the steep slope of the transfer curves at the intersections, the CMOS inverter is biased for peak gain, at the sweet-spot, in each of these curves. Measuring and storing the self-biasing sweet-spot allows correction for errors that may have resulted from parametric variations.

These circuit design approaches work because of the following observations . . . .

Observation 1: The sweet spot is the voltage where the two transistor gates influence their respective channels to conduct at the same current. Since the current in one channel must be equal to the current in the other (it has nowhere else to go) the feedback (being negative in its sign) causes an equilibrium point to be reached, with an error that is inversely proportional to the gain of the inverter. A voltage included in the feedback path introduces a displacement term in the aforementioned relationship.

Observation 2: An inverter with feedback as shown in this embodiment is an analog computer, seeking to resolve a differential equation such that the difference between input and output is zero, where the sign disappears, offering no vector to the output that would affect a chance. A voltage inserted in the feedback path would add an additional term to the equation.

Observation 3: Ohm's law tells us E=I*R, so if I=Zero, E is unaffected by R. Voltage stored on capacitors remain unchanged in a circuit where no current flows through those capacitors. An inverter with a high impedance input never provides a disruptive current path. This preserves a capacitors voltage when it is connected to the high impedance inverter input.

Observation 4: All disturbing paths are parasitic. Any parasitic capacitance associated with the inverter input is invisible because this input voltage remains at the sweet-spot.

Since the gain of an amplifier may be expressed as $\Delta Vout/\Delta Vin$, an inverting amplifier with an open loop gain of 10 and a +1 unit change on its input causes a −9 unit change of its output; this means the output will come to rest only 9 units from where it started. A gain of 1000 requires only a +0.01 change on its input to achieve a −9.99 unit change on the output, meaning the output will come to rest at 9.99 units from where it started. Going from a gain of 10 to a gain of 1000 reduced the output error from 10% to 0.1%.

FIG. 6, is provided to summarize the effect of adding gain stages. The gain of an inverter chain establishes the lower limit for resolving small signals. When resolving small signals with a single stage (inverter), the typical gain of 30 indicates that 33 mV are required for a 1 volt output, while 3 gain stages allows 33 uV to achieve the same 1 volt output. Five stages require only 40 nV, and with 7 stages the input sensitivity increases to 0.050 nV for a 1 volt output. At 7 stages with a typical gain of 20 Billion, the surrounding noise makes this configuration ridiculous; however if we consider the LOW gain figure for 7 stages (1.3 Billion) then an input of 0.8 nV (instead of 0.050 nV) would be required for the same 1 volt output. As in any closed loop system, additional gain allows linearity to be maintained especially at extreme output signal swings (near the power supply rails, where the gain diminishes further).

Figure 7A:
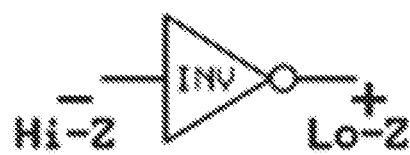
FIG. 7a shows a logic symbol of a digital inverter used as gain state of the present invention.
Figure 7B:
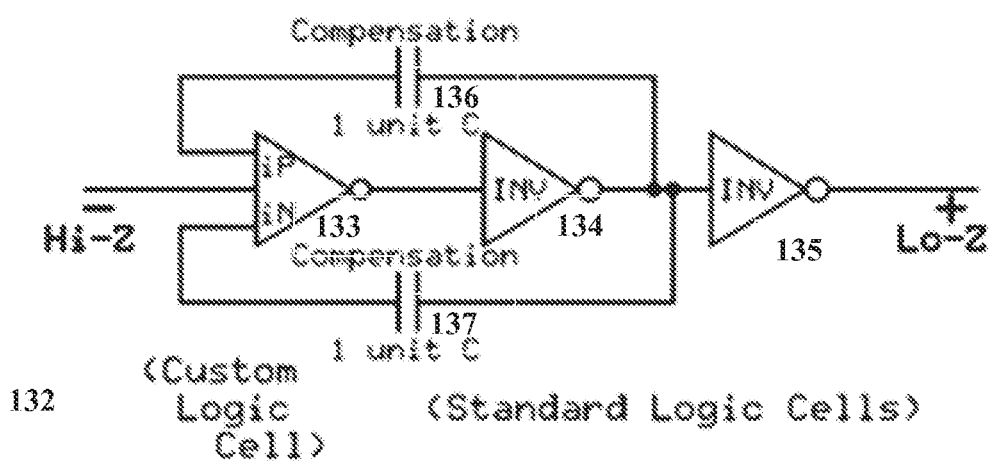
FIGS. 7b to 7e show schematic diagrams of various gain and compensation configurations for the analog amplifiers of the present invention.
Figure 7C:
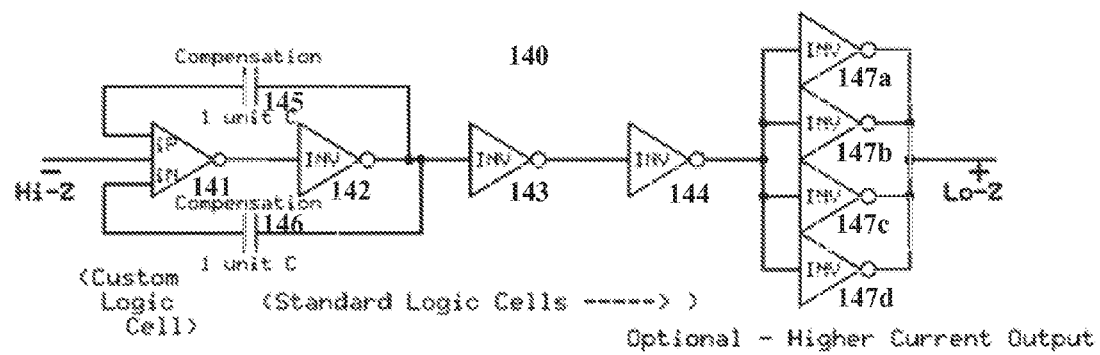

FIG. 7a shows a logic symbol of a digital inverter used as a gain stage in the present invention. In order to increase the open loop gain additional inverters must be cascaded. The inverter cascade must have an output sign that is the inverse of its input sign, so the total of all stages must be odd in number as shown in FIGS. 7b and 7c. The total open loop gain is the product of the gain of all the separate stages.

Figure 8:
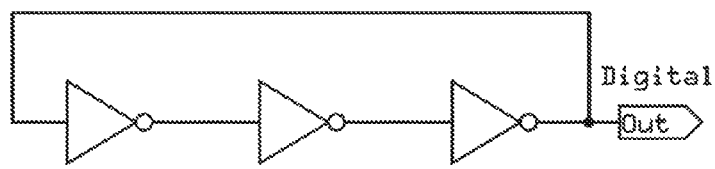
FIG. 8 shows a block or schematic diagram of a ring oscillator.

FIG. 8 is a ring oscillator, a commonly found configuration of a digital circuit. This is constructed as an odd number of inverters, cascaded, with the final inverter output connected back to the input, thus closing the loop. This circuit will always oscillate. It looks remarkably like the high gain version of the amplifier in the present invention when its output is connected back to its input (to close the loop).

The oscillation is a result of the accumulated phase delay through all the stages. The traditional approach to stopping this oscillation is to insure that the closed loop gain, at the frequency determined by the phase shift around the loop, is less than unity.

A single inverter circuit does not oscillate because there is insufficient phase shift. Adding additional gain stages in the feedback path contributes additional phase delay and causes an uncompensated amplifier circuit to oscillate.

If any even number of inverters are cascaded, and their output is tied back to the input, the circuit will latch (i.e. go to a power rail and stay there). This configuration will neither oscillate nor amplify.

Figure 7D:
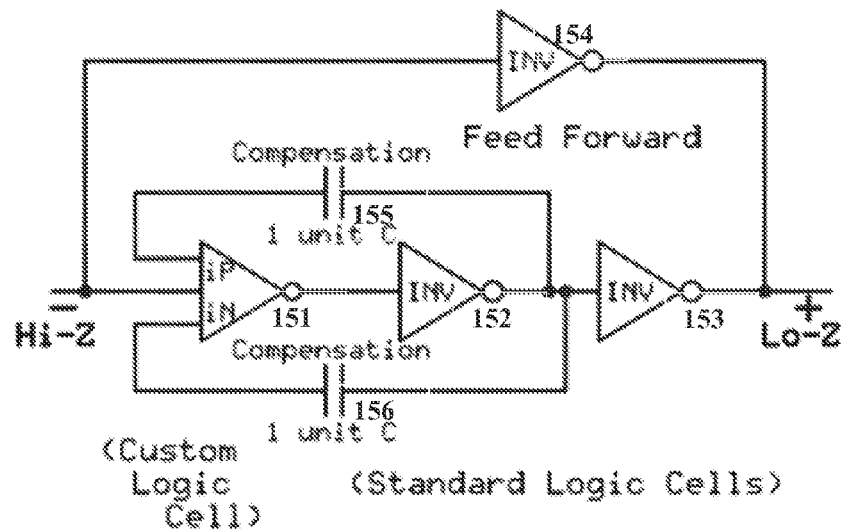
Figure 7E:
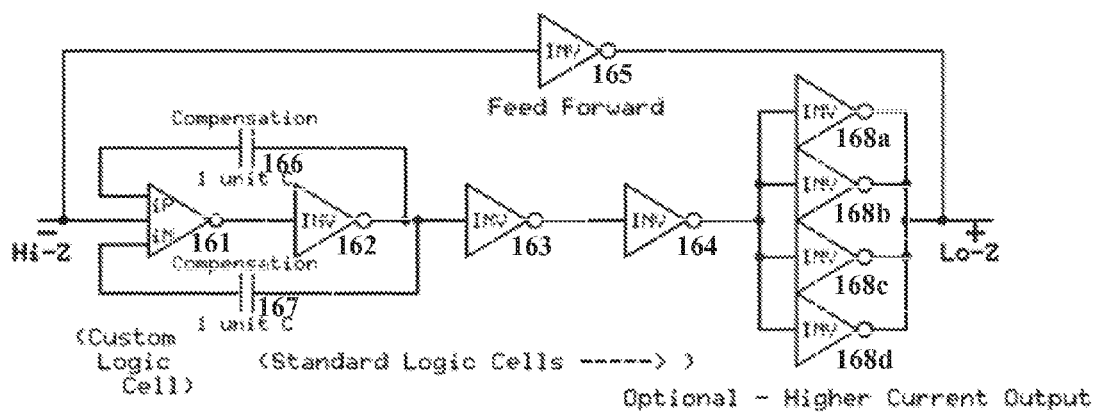

This closed loop amplifier oscillation can be prevented by slowing down a single stage of many cascaded stages, however this method has an undesired side effect in that it slows the entire amplifier. An invention called "feed-forward" (FIGS. 7d and 7e) recoups most of this loss of speed, by getting the output moving sooner. It uses a parallel lower gain but faster path to get the output moving quickly, while the higher precision slower path is coming to its new precision value. In combination, slowing down one inverter, while bypassing ("feed-forward") the remaining inverters produces an optimal configuration. This is especially desirable when a higher gain cascade of 5 or 7 inverters is used.

Figure 9A:
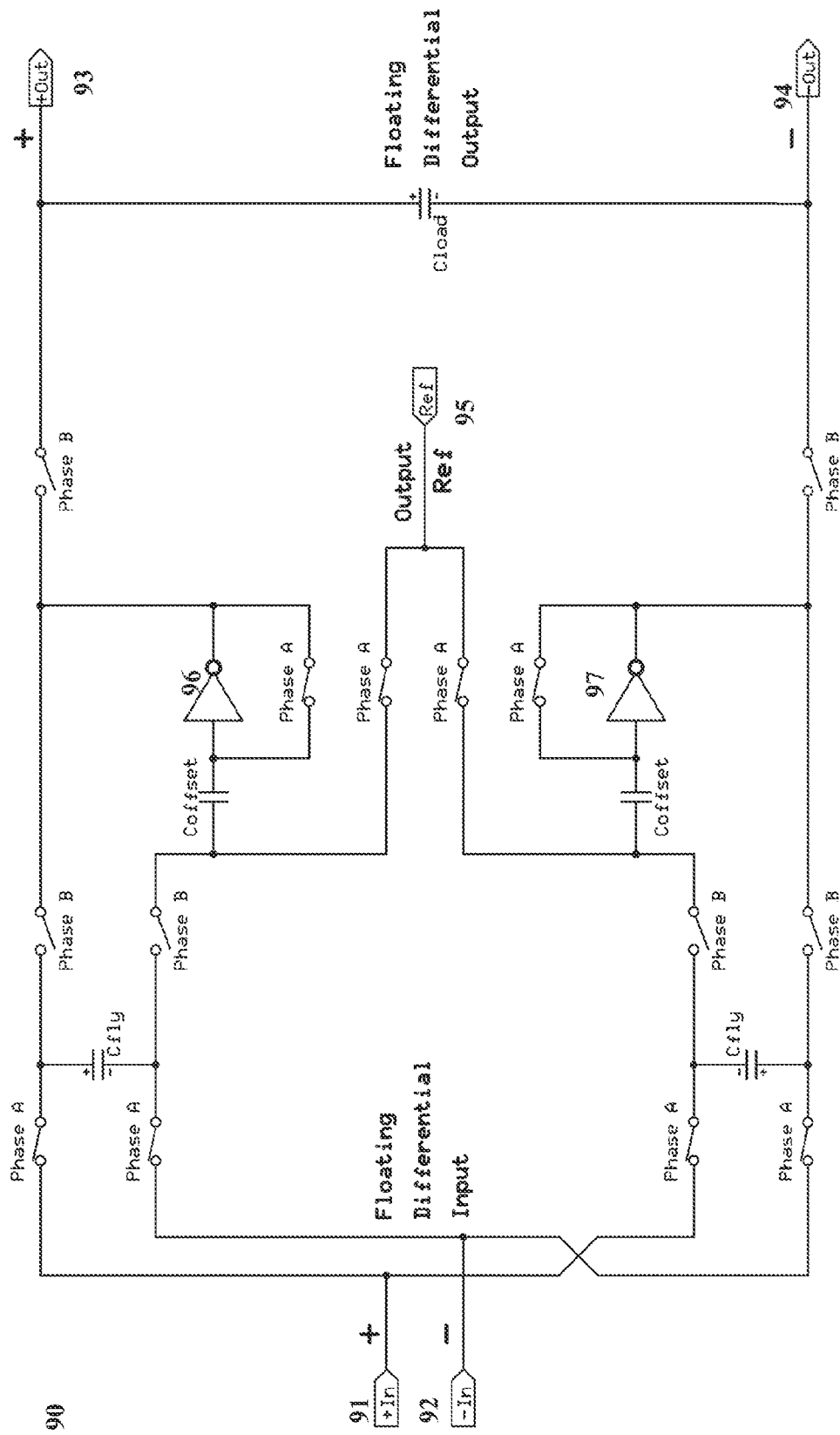
FIG. 9a shows a schematic diagram of a floating differential instrumentation style amplifier, having individually referenced (floating) inputs and outputs, with a precision gain of 2 in accordance with the principles of this invention. Switches shown therein referred to by "Phase A" provides ON state when in setup phase of clock signals, while switches of "Phase B" provides ON state when in enable phase of clock signals.

Two identical single ended output amplifiers can be configured to implement a differential output, instrumentation style amplifier, which runs at logic speed. A precise 2× gain differential implementation instrumentation style amplifier illustrative of the present invention, is shown in FIG. 9a. The operation of FIG. 9a is the same as FIG. 2a with the exception that the bottom amplifier, including inverter 97, has its inputs reversed in polarity from the top amplifier, including inverter 96, and its differential outputs share a common mode reference 95 about which the outputs operate. Again the inputs can operate beyond the power supply rails, limited by the substrate or well junctions.

Figure 9B:
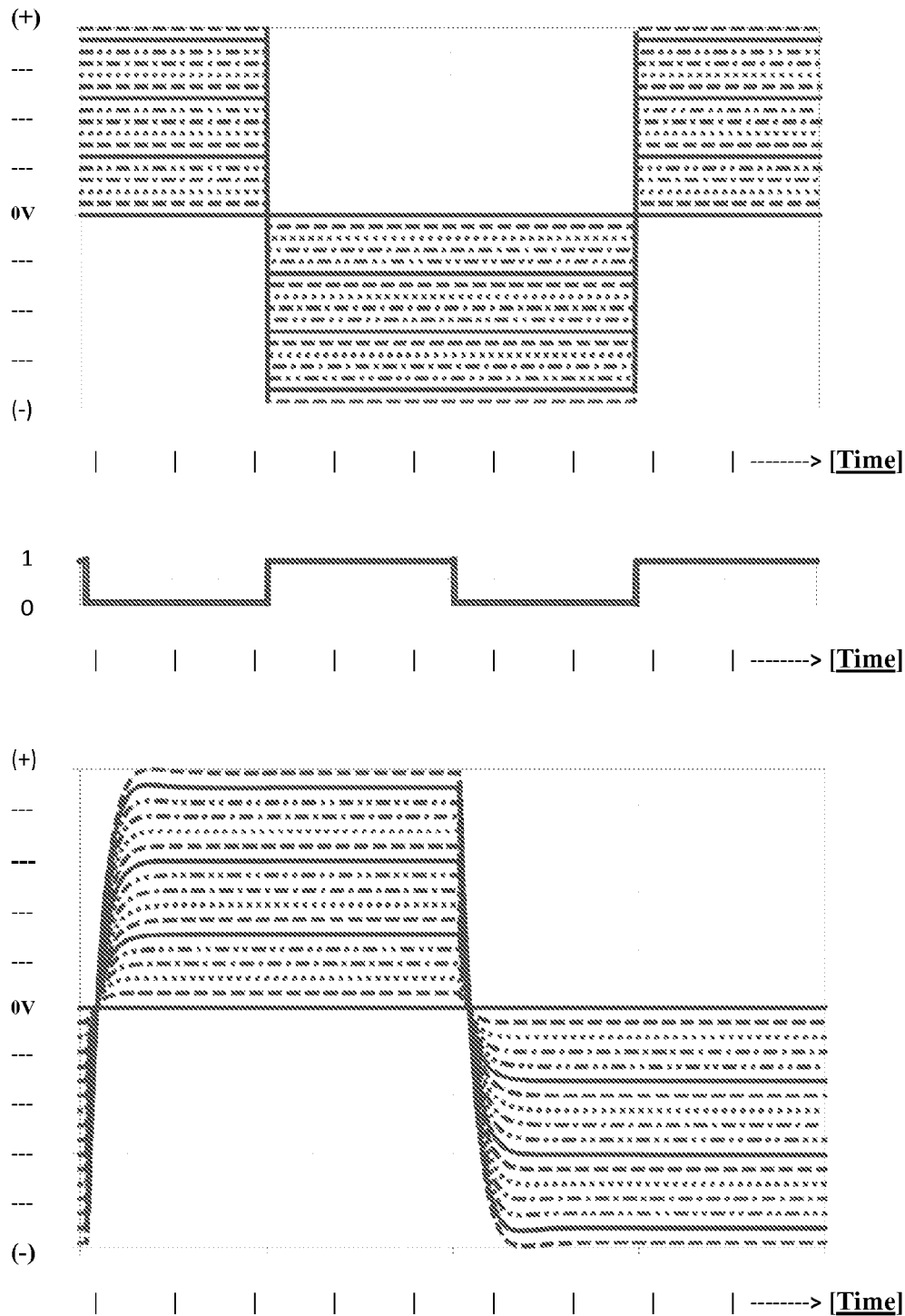
FIG. 9b shows graphs illustrating linearity of the differential instrumentation style amplifier of FIG. 9a for a progressively increased input amplitude steps.

FIG. 9b shows graphs regarding linearity of the differential instrumentation style amplifier of the present invention, shown in FIG. 9a. The graph shows the amplifier 90 response to an array of alternating polarity input steps (each having slightly increased magnitude) differentially presented to In 91 and In 92. The amplifier's differential output voltage is between Out 93 and Out 94, with the output (analog ZERO) at Ref 95.

Referring back to FIG. 9b, Rise & Fall times are comparable to logic rise/fall times. It should be noted that the response is fast, stable, and is linear. This same graph applies to the response of the circuits in FIG. 2a, FIG. 3, and FIG. 4, in terms of speed, stability, and linearity.

Analog Comparator

The preferred embodiment for ultra-deep-submicron analog signal processing is to convert those analog signals into numbers (digital) as early as possible, then use logic and algorithms from there on. However, the construction of analog circuits at ultra-deep-submicron scale has failed, using conventional means. The comparator, as depicted in this present invention, serves as a key element (along with the amplifier) to allow fast, precise, and sensitive measurements to be made with circuits constructed at ultra-deep-submicron scale using digital logic parts. This scheme works where the prior art has failed. The present invention works at any integrated circuit process scale where precision is required.

A variation similar to the amplifier circuit provides a high precision comparator. The comparator does not have a negative feedback path and so operates open loop. Operation around a sweet-spot provides the comparator with the same advantages as the amplifier in terms of ageing, temperature, power supply voltage, and 1/f phenomena such as shot noise, and operation at the maximum gain-per-stage point, sweet-spot.

Necessary comparator precision is achieved with additional cascaded inverters to increase overall gain. This additional gain tends to slow the comparator, but parallel feed-forward techniques can recover much of the speed lost due to additional gain stages.

The comparator is comprised of an input capacitor, some switches or transmission gates, and several inverters cascaded to provide sufficient resolution, as required. The input capacitor on the comparator circuit in combination with the sweet-spot is in fact the comparator, connecting first to one signal input and then the other, the difference between the two input signals pushes the first stage inverter either above or below the sweet-spot. Because the comparison is always made at the sweet-spot, resolution and response is independent of input signal voltage, and linearity errors found in conventional analog designs do not appear. The aperture time is defined by the slew rate of the clock, very fast, almost instantaneous, for maximum accuracy.

Figure 10:
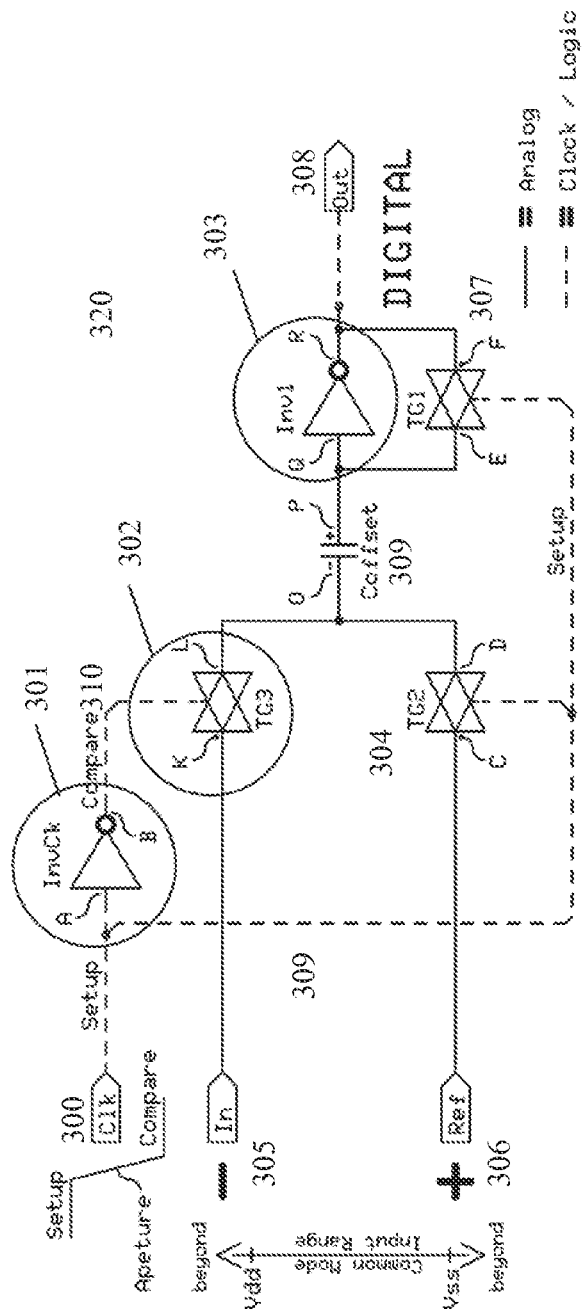
FIG. 10 shows a schematic diagram of an analog comparator in accordance with the present invention.

FIG. 10 shows a schematic view of an analog comparator 320 of the present design. Transmission gates 302, 304 and 307 are made as shown in FIG. 2b, with both N-channel 101 and P-channel 102 FETs. Using a complimentary pair of FETs reduces switching noise and allows operation with analog signals that are mildly beyond the power supply rails. It is further noted that the control signals for the transmission gates 302, 304 and 307 are provided by complementary and coincident clock signals as shown in FIG. 2c, further contributing to the low noise aspects. It should be noted that "Break-Before-Make" design should be utilized to prevent short circuits between different sections. Finally, FIG. 10 inverter 303 is an abstraction of the circuit shown in FIG. 2e (or similar high impedance inverting gain stage) with the provision that N-channel 121 and P-channel 122 devices are sized to enhance operation at the sweet spot.

At the transition of clock Clk 300 in FIG. 10, from setup phase to compare phase, the output terminal R of invertor 308 produces a digital representation of the analog voltage difference between terminals In 305 and Ref 306. Operation of the two phases of the comparator 320 is described below:

Setup Phase:

The sweet-spot is the most sensitive operating point, ready to slew toward a logic 1 or a logic 0.

During the setup phase, clock Clk 300 instructs the transmission gates 304 and 307 to be ON and 302 to be OFF. While transmission gate 307 causes the inverter 303 input Q to be held balanced at the sweet-spot by the low impedance of Output R, transmission gate 304 connects Ref 306 to charge offset capacitor 309 to the difference between the sweet-spot and Ref 306. Ref 306 may operate at any voltage from Rail-to-Rail and beyond, as previously mentioned. If the reference voltage at Ref 306 does not change over time, the voltage on offset capacitor 309 remains unchanged and there is no current flow and no change in the charge stored on offset capacitor 309.

Compare Phase:

During the compare phase, clock Clk 300 instructs the transmission gates 304 and 307 to be OFF and transmission gate 302 to be ON. The input Q of inverter 303, now being a high impedance, is connected to the signal at In 305, allowing the difference voltage (between In 305 and Ref 306) to tip the balance of the inverter 303 input Q. Since the input at Q is high impedance, the voltage across offset capacitor 309 does not change, no current flows and so no charge time is required for offset capacitor 309, allowing operation at the maximum speed the logic will support.

Since the input comparison point is at the same voltage as before the change from setup phase to compare phase, any potential errors due to parasitic capacitance on the inverter 303 input Q are eliminated. Careful non-overlapping timing between the setup phase and compare phase is desired to prevent disturbance of capacitor charge between phases.

FIG. 11a shows a comparator with increased gain (extra stages) in accordance with the present invention. Undesirable noise comes from unintentional coupling, power supply transient, 1/f noise and resistance noise, among others. Unintended coupling can be minimized by careful layout, including the use of guard bands. Power supply transients are minimized by the use of ground planes and eliminating "ground loops." Even at Gigahertz speed, the 1/f noise contribution is about 50 nv, this easily compromises the sensitivity for 6 gain stages. In addition, reduced aperture time effectively increases the operational speed, leaving less time for 1/f noise to disturb the signal. Referring to FIG. 11d, aperture time may be improved by pre-biasing the cascaded stages, each one at its sweet spot or tipping point. Resistance noise is greater at lower currents, where the resistance is obviously higher. In this regard, when inverters are operated at the sweet-spot, they have the least resistance noise because both P channel and N channel transistors are operating at the highest current, lowest resistance this yields the best resolution for comparator or amplifier.

FIG. 11b shows a schematic diagram of an implementation of the comparator 420, which introduces more problems than it solves (high input sensitivity, long prop delays). In this configuration, slight differences in inverters cause subsequent inverters to operate off their sweet-spot, reducing the actual gain of said inverters. This may require the subsequent inverters to come back through their sweet spot, allowing for noise injection into the signal path while the comparator ripples to its final decision. The output may go to one logic level (in error) and then recover to the desired state later. This extends the time to reach the final output decision.

Figure 11C:
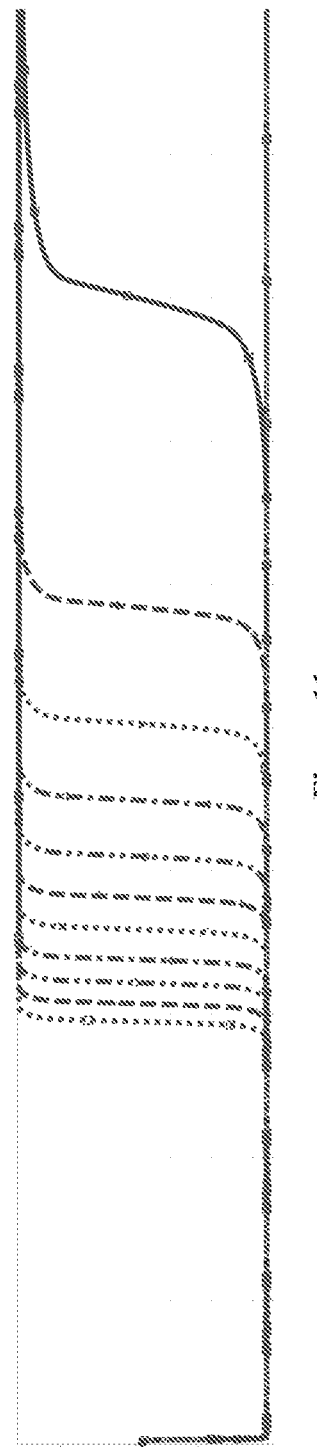
FIG. 11c shows a graph of output response by the comparator shown in FIG. 11b to a finely stepped input.
Figure 11D:
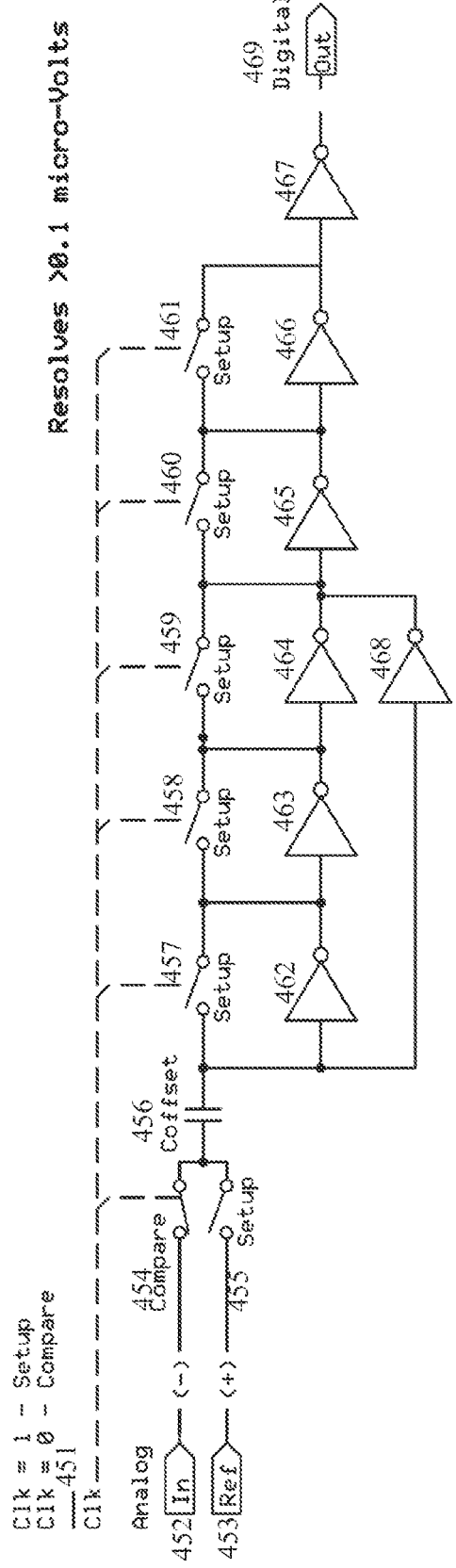
Figure 111E:
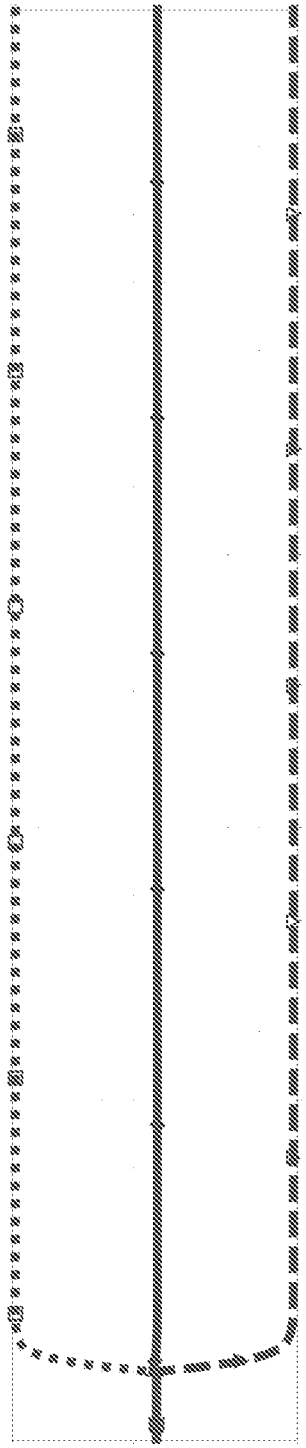

FIG. 11c shows a composite graph of output response by the comparator shown in FIG. 11b to a finely stepped input. Each transition, from left to right, is the response to a smaller and smaller input amplitude. Note that the trace on the far right is the result of the input being exactly equal to the reference. The output is always against one rail or the other, never at the sweet spot, thus the long decision times. The conclusion is, smaller amplitude signals require more time for the signal to propagate through the chain of inverters. The Feed-Forward circuit, shown in FIG. 11d, can improve the response time in a high resolution comparator.

The circuit of FIG. 11d shows another comparator circuit, having stages pre-biased at the sweet spot, where gain is highest and slew rate is highest, improving response time, thus reducing the noise window and making the result available sooner.

FIG. 11e shows a composite graph of output response by the comparator shown in FIG. 11d to three input voltage levels, threshold, just below threshold, and just above threshold. Note that the trace in the center is the result of the input being exactly equal to the reference (threshold). The conclusion is, the response to the smallest of steps is almost immediate, by comparison, when the intermediate gain stages are also self-biased at their sweet spot. Feed-Forward plays no small part in this accomplishment!

Feed-Forward

This implementation of feed-forward (FIGS. 7d, 7e and 11d) is only an example of the concept. The idea of a short path to get the output going in the right direction paralleled by a longer high-gain path to ensure accuracy is the concept at the heart of feed-forward. It is applicable in both amplifiers and their special case implementation called comparators.

It would be a scope of the present invention that this technology can be used to solve present problems and enable future advancements in the field. It should be understood that the embodiments and variations shown and described herein are merely illustrations of the principles of this invention and that various modifications may be implemented by those skilled in the art without departing from the spirit and scope of the present invention.

The invention claimed is:

1. An amplifier comprising:
   a. an inverter having an input and an output;
   b. a plurality of switches operable with clock signals providing a setup phase and an enable phase;
   c. a first capacitor, having a first terminal and a second terminal, and the second terminal of the first capacitor is in communication with the input of the inverter;
   d. a second capacitor having a first terminal and a second terminal;
   wherein
   during the setup phase of the clock signals, the plurality of switches are configured to connect:
      the input and the output of the inverter, and
      the first and second terminals of the second capacitor to first and second input terminals of the amplifier, respectively, for storing a differential input voltage; and
   during the enable phase of the clock signals, the plurality of switches are configured to connect:
      the first terminal of the second capacitor and the first terminal of the first capacitor, and
      the second terminal of the second capacitor to the output of the inverter.

2. An amplifier as in claim 1, wherein the clock signals are complementary and coincident clocks.

3. An amplifier as in claim 1, wherein the inverter is a CMOS inverter.

4. An amplifier as in claim 1, wherein the plurality of switches are transmission gates.

5. A sum or difference amplifier for first and second inputs, comprising:
   an inverter having an input and an output;
   a plurality of switches, operable by clock signals having setup and enable phases;
   first, second and third capacitors, each having first and second terminals, the second terminal of the first capacitor is in communication with the input of the inverter;
   wherein during the setup phase of the clock signals, the plurality of switches are configured to connect:
      the input and the output of the inverter,
      a output zero reference of the amplifier to the first terminal of the first capacitor, a second input terminal of the first input of the amplifier to the second terminal of the second capacitor, a first input terminal of the first input of the amplifier to the first terminal of the second capacitor, a second input terminal of the second input of the amplifier to the second terminal of the third capacitor, and a first input terminal of the second input of the amplifier to the first terminal of the third capacitor; and during the setup phase of the clock signals, the plurality of switches are configured to connect:

the second terminal of the second terminal to an output terminal of the amplifier, the first terminal of the second capacitor to the second terminal of the third capacitor, and the first terminal of the third capacitor to the first terminal of the first capacitor.

6. A precision twice gain analog amplifier, comprising an inverter having input and output;

an offset capacitor, and first and second capacitors, each having first and second terminals;

a plurality of switches operable by clock signals having setup and enable phases;

wherein the second terminal of the offset capacitor is connected to the input of the inverter;

wherein during the setup phase of the clock signals, the plurality of switches are configured to connect:

the input and the output of the inverter, an output zero reference to the first terminal of the offset capacitor, a second input terminal of the amplifier to the second terminal of the first capacitor, the second input terminal of the amplifier to the second terminal of the second capacitor, a first input terminal of the amplifier to the first terminal of the first capacitor, and the first input terminal of the amplifier to the first terminal of the second capacitor; and during the enable phase of the clock signals, the plurality of switches are configured to connect:

the second terminal of the first capacitor to an output terminal of the amplifier, the first terminal of the first capacitor to the second terminal of the second capacitor, and the first terminal of the second capacitor to the first terminal of the offset capacitor.

7. A precision twice gain analog amplifier as in claim 6, wherein capacitances of the first and second capacitors are different.

8. A comparator operative to compare the difference between a reference voltage at a reference terminal and an unknown input voltage at an input terminal, comprising:

an inverter having input and output;

a capacitor having first and second terminals, the second terminal of the capacitor is in communication with the input of the inverter, and a plurality of switches operable by clock signals having setup and compare phases, wherein during the setup phase of the clock signals, the plurality of switches are configured to connect the output and the input of the inverter, and a reference terminal of the comparator to the first terminal of the capacitor; and during the compare phase of the clock signals, the plurality of switches are configured to connect an input terminal of the comparator to the first terminal of the capacitor.

* * * * *